United States Patent [19]

Dillman

[11] Patent Number: 4,910,465

[45] Date of Patent: Mar. 20, 1990

[54] PHASE DETECTOR

[75] Inventor: Richard F. Dillman, Lexington, Mass.

[73] Assignee: Hewlett-Packard Company, Palo Alto, Calif.

[21] Appl. No.: 264,412

[22] Filed: Oct. 31, 1988

[51] Int. Cl.$^4$ .......................... G06F 9/06; G06F 7/544; G01R 25/00

[52] U.S. Cl. .................................. 328/133; 328/145; 364/715.01

[58] Field of Search ............... 328/133, 145, 158, 159; 364/715.01

[56] References Cited

U.S. PATENT DOCUMENTS

| | | | |
|---|---|---|---|
| 4,373,191 | 2/1983 | Fette et al. | 364/715.01 |
| 4,568,978 | 2/1986 | Cosh | 328/145 |
| 4,680,721 | 7/1987 | Pluddemann | 328/133 |
| 4,710,892 | 12/1987 | Fling | 364/715.01 |
| 4,715,000 | 12/1987 | Premerlani | 328/133 |
| 4,721,904 | 1/1988 | Ozaki et al. | 328/133 |
| 4,745,309 | 5/1988 | Waller | 328/145 |
| 4,807,171 | 2/1989 | Gale | 364/715.01 |

Primary Examiner—John S. Heyman
Attorney, Agent, or Firm—Frank R. Perillo

[57] ABSTRACT

This invention relates to a circuit for detecting the phase of an AC signal of frequency f. The signal is applied to two mixers one of which mixes the AC signal with a first signal of frequency f to generate a signal I and the other of which mixes the AC signal with a second signal of frequency f which is 90 degrees out of phase with the first signal to generate a signal Q. The I and Q signals are digitized and the log of the absolute value of each of the digitized signals is generated. The log generating function may for example be performed with a table-look-up memory. One log value, for example log I, is substracted from the other log value and the Arctan of the antilog of this difference is then generated. The Arctan function may also be generated using a table-look-up memory. The resulting Arctan value is indicative of the phase of the AC signal. The quadrant for the AC signal is determined by saving the sign of the digitized I and Q signals before taking the logrhythm of the absolute values of these signals and applying these signs along with the Arctan signal to a qradrant circuit. For a preferred embodiment, the phase detector is utilized as a part of a color flow Doppler system, the AC signal being the output from an ultrasonic Doppler transducer system and the determined phase being utilized to control the Doppler color flow display.

9 Claims, 3 Drawing Sheets

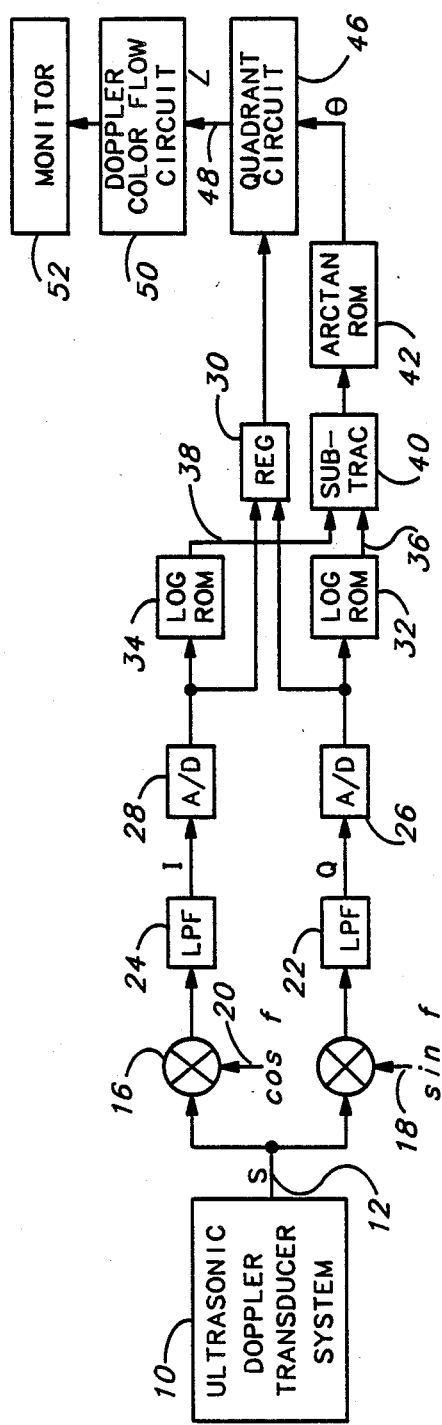
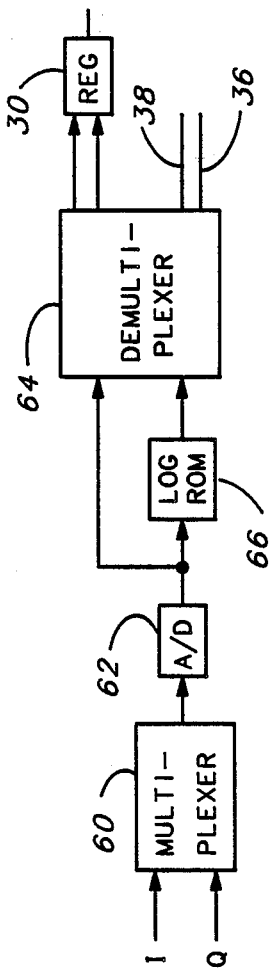
FIG 1
FIG 2
FIG 3

PHASE DETECTOR

FIELD OF THE INVENTION

This invention relates to phase angle detectors and more particularly to a phase angle detector for use in an ultrasonic color Doppler system.

BACKGROUND OF THE INVENTION

There are many applications where a high precision phase angle determination is required for an AC siqnal of selected frequency. One such application is an ultrasonic Doppler system where the difference of successive phase angles of the received signal is indicative of both the direction of flow of blood at the point being scanned and of the velocity of such flow. The detected phase angle difference is utilized to control the color of the display in the selected area, the color being indicative of both the direction of blood flow, and its velocity. In certain applications, it is required that this information be provided with a high degree of precision.

In conventional systems utilized for detecting phase in this application, the incoming signal is split to produce two signals, one of which is mixed with a first signal at the frequency of the incoming signal and the other of which is mixed with a signal at the same frequency but 90 degrees out of phase with the first signal. The resulting signals are then digitized and the digitized values are applied as address inputs to a table-look-up ROM, the output from the ROM being the Arctan of the quotient of the generated signals. This Arctan value is equal to the desired phase.

With phase detectors of this type, higher degrees of precision are obtained by increasing the number of digits in the digitized signal, and thus in the address inputs to the table-look-up ROM. This means that for each digit increase in precision, the size of the ROM increases exponentially. High precision readings can therefore result in the requirement for a very large table-look-up ROM. Since the division function to obtain the Arctan is a relatively slow function as performed in a computer, obtaining the Arctan function in this way in order to obtain a phase value is not a viable alternative to the table-look up procedure in most applications.

A need therefore exists for a high precision phase detector which does not require the use of a large table-look-up memory while still providing rapid response.

SUMMARY OF THE INVENTION

In accordance with the above, this invention provides a circuit for detecting the phase of an electrical signal at a frequency f which circuit initially mixes the electrical signal with a first signal of frequency f to generate a signal I and also mixes the signal with a second signal of frequency f, which second signal is 90 degrees out of phase with the first signal, to generate a signal Q. The signals I and Q are digitized and the log of each of these digitized values is generated. The difference log Q minus log I is then generated and a means is provided for generating the Arctan of the antilog of this difference, this Arctan being indicative of the desired signal phase. More particularly, when the log I and log Q values are generated, these are the logs of the absolute values of the signals I and Q. The signs of the I signal and the Q signal are also stored and these stored signs are utilized to determine the quadrant for the signal phase. For a preferred embodiment, the log generating means includes at least one table-look-up memory and may include a separate table look-up memory for each log generation. Similarly, the Arctan generating means may also be a table look-up memory.

The foregoing and other objects, features and advantages of the invention will be apparent from the following more particular description of preferred embodiments of the invention as illustrated in the accompanying drawings.

IN THE DRAWING

FIG. 1 is a schematic block diagram of a preferred embodiment of the invention;

FIG. 2 is a logic diagram illustrating the operation of the quadrant circuit of FIG. 1; and FIG. 3 is a schematic block diagram of a portion of the circuit for an alternative embodiment of the invention.

DETAILED DESCRIPTION

Referring to FIG. 1, a standard ultrasonic Doppler transducer system 10 generates an AC output signal S on line 12 which is applied as one input to mixing circuits 14 and 16. The signal S is at a known frequency f. An ultrasonic Doppler transducer system suitable for use as the system 10 is contained in the Hewlett-Packard Model 77020A Rev K ultrasonic scanning system. The other input to mixer 14 is a signal on line 18 which is a sin signal at frequency f. The other input to mixer 16 is a cosin signal at frequency f on line 20. The signals on lines 18 and 20 may be obtained from a suitable source. In other words, the signals on lines 18 and 20 are two signals at frequency f which are 90 degrees out of phase with each other.

The outputs from mixers 14 and 16 are passed through low pass filters 22 and 24 respectively which eliminate the upper mixer product of the mixed signal. The outputs from filters 22 and 24 will be referred to as the Q and the I (i.e., quadriture and in-phase) signals respectively. The Q and I signals are passed through analog to digital converters 26 and 28 respectively which generate digitized versions of the Q and I signals with a desired degree of precision. One bit, for example the most significant bit, of each of the digitized values is indicative of the sign of the value, being a 0 if the value is plus and a 1 if the value is minus. The precision of the analog to digital converters may, for example, be 16 bits, with the 16th bit being indicative of sign and the 16 bits representing the value in twos complement form.

The most significant bit of the output from each of the analog-to-digital converters is applied to and stored in register 30. All of the bits of the output from A to D converter 26 are applied to a log ROM 32 and all of the bits of the output from A to D converter 28 are applied to a log ROM 34. The inputs to the log ROMs 32 and 34 serve as address inputs to a table-look-up, the outputs from each of the ROMs being a digital representation of the log of the absolute value of the input. Thus, the output from ROM 32 on line 36 is equal to log |Q| and the output on line 38 from ROM 34 is equal to log |I|.

The log values on lines 36 and 38 are applied as the inputs to a subtraction circuit 40. While the exact order in which the subtraction occurs is not critical, for purposes of this embodiment it will be assumed that subtraction circuit 40 subtracts the value on line 38 from the value on line 36 (i.e., generates the value log

|Q| − log |I|). The output from subtraction circuit 40 is applied as an address input to Arctan ROM 42.

The output from ROM 42 is the Arctan value of the antilog of the applied logarithmic difference from subtractor 40. This Arctan value, which is indicative of phase angle, is applied as one input to quandrant circuit 46. The other inputs to quandrant circuit 46 are the sign bits from register 30. FIG. 2 is a truth table which illustrates how circuit 46 operates on the input angle $\theta$ depending on the sign inputs from register 30 to obtain the phase angle of the signal S on line 12. FIG. 2 also illustrates the quandrant in which the resultant angle falls. Circuit 46 may be implemented in any standard fashion such as with a programmed microprocessor, a table-look-up memory or with hard wired logic. At this time, hard wired logic is the preferred embodiment. It is also possible to combine Arctan ROM 42 and quadrant circuit 46 in a single ROM with the address inputs to this ROM being both the output from subtract circuit 40 and the sign bits from register 30.

The output phase angle on line 48 is applied to a standard Doppler color flow circuit 50 which generates the signals required to cause an image on monitor 52 at a particular point to be of a selected color and tilt or intensity depending on the difference in successive detected phase angles on line 48 at that point. As previously indicated, the sign of the difference is indicative of the direction of blood flow and, together with the other bits, controls the color of the display. Circuitry suitable for use as the circuit 50 and monitor 52 are utilized in the beforementioned Hewlett Packard Model 78020A Rev K ultrasonic system.

Since the subtraction operation in circuit 40 may be performed quickly, the circuit shown in FIG. 1 is adapted for rapid determination of phase angle. Further, since the size of ROMs 32, 34 and 42 increase linearly rather than exponentially with increases in precision, high levels of precision can be obtained with the circuit of FIG. 1 without requiring the use of large memories. A circuit is thus provided which affords high precision phase determinations at high speed without undue cost.

One disadvantage of the circuit shown in FIG. 1 is that it requires the use of three ROMs. Since log ROMs 32 and 34 are being used to perform the identical function, a significant reduction in hardware, and thus in cost, may be achieved by multiplexing the use of this memory. FIG. 3 illustrates a circuit which is the same as that shown in FIG. 1 except that the Q and I signals from filters 22 and 24 respectively are multiplexed in a multiplexer circuit 60. The output from multiplexer 60 is applied to an A to D converter 62 which is the same as the A to D converters 26 and 28 and performs the same digitization function as these converters. The most significant bit (i.e., the sign bit) of the output from A to D converter 62 is applied through a demultiplexer 64 to register 30, register 30 being the same as register 30 in FIG. 1. All the bits of the digitized output from circuit 62 are applied to log ROM 66 which ROM is the same as log ROMs 32 and 34 and performs the same function as these ROMs. The output from ROM 66 is applied through demultiplexer 64 to either line 36 or 38 leading to subtraction circuit 40 (FIG. 1). With this embodiment of the invention, either memory would have to be provided to store the first log value applied to subtract circuit 40 from the multiplexer 64 until the second value is received so that the subtraction operation could be performed, or subtract circuit 40 would have to have this memory capability. Except as indicated above, the circuit of FIG. 3 functions in all respects in the same manner as the circuit shown in FIG. 1.

While the circuit of FIG. 3 is advantageous in that it reduces the number of elements, and thus the cost of the circuit, the price for this saving is that it takes longer to complete the phase detection operation. When very high speed operation is required, the delays introduced by sharing components 62 and 66 and by the multiplexing and demultiplexing operations may not be acceptable, in which case the circuit of FIG. 1 would be utilized. Where high speed operation is not a requirement, the circuit of FIG. 3 may be preferable.

It should be noted that while in FIG. 3 multiplexing has been shown as being accomplished at the output of the low pass filters 22 and 24, it is apparent that multiplexing could be accomplished at other points in the circuit. For example, depending on the time required for various operations to be performed, multiplexing might also be performed at the outputs from A to D converters 26 and 28.

While the phase detection circuit of this invention has been shown using table-look-up ROMs to perform the log and Arctan functions, it is apparent that these functions could also be performed in other ways. Further, while the circuit has been shown as used in a color flow Doppler system, the circuit might also be utilized in other applications where high precision phase detection of an AC signal of frequency f is required.

Further, while the invention has been particularly described above with respect to determining the Arctan function for purposes of doing phase detection, similar problems arise in other applications where function of a ratio of two values is required with a high degree of precision. Thus, the circuit of FIG. 1 or FIG. 3 could be utilized to determine the values $$i = \frac{I}{\sqrt{I^2 + Q^2}} = \frac{1}{\sqrt{1 + (Q/I)^2}} \quad (1)$$

$$q = \frac{Q}{\sqrt{I^2 + Q^2}} = \frac{1}{\sqrt{1 + (I/Q)^2}} \quad (2)$$

which values are useful for normalizing a vector. The only change required to perform either the function of equation (1) or equations (2) above rather than the phase detection function would be in the values stored in ROM 42.

Thus, while the invention has been particularly shown and described above with reference to preferred embodiments, the foregoing and other changes in form and detail may be made therein by one skilled in the art without departing from the spirit and scope of the invention.

What is claimed is:

1. A circuit for detecting the phase of an electrical signal of frequency f comprising:
   means for generating first and second signals of frequency f which signals are 90 degrees out of phase;
   means for mixing the electrical signal with the first signal to generate a signal I and with the second signal to generate a signal Q;
   means for digitizing the signal I and the signal Q;
   means for generating log |I| and for generating log |Q|;
   means for generating the difference between log |Q| and log |I|; and means for generating the Arctan of the antilog of said difference, said Arctan being indicative of the desired signal phase.

2. A circuit as claimed in claim 1 including means for storing the sign of the signal I and the sign of the signal Q; and means for utilizing said stored signs to determine the quadrant for said signal phase.

3. A circuit as claimed in claim 2 wherein said quadrant determining means operates in accordance with the following logic table where $\theta$ is the angle generated by the Arctan generating means:

| Sign I | Sign Q | Angle | Quad |
|--------|--------|-------|------|
| +      | +      | $\theta$ | 1 |
| −      | +      | $-\theta$ | 2 |
| −      | −      | $\pi-\theta$ | 3 |
| +      | −      | $\pi+\theta$ | 4 |

4. A circuit as claimed in claim 1 wherein said log generating means includes at least one table-look-up memory.

5. A circuit as claimed in claim 4 wherein said log generating means includes two table-look-up memories, one of which is addressed by the digitized I value and the other of which is addressed by the digitized Q value.

6. A circuit as claimed in claim 4 including means for multiplexing the table-look up memory of said log generating means.

7. A circuit as claimed in claim 1 wherein said Arctan generating means includes table-look-up memory.

8. A circuit as claimed in claim 1 wherein said signal phase difference is indicative of the direction and velocity of blood flow as detected by an ultrasonic Doppler system.

9. A circuit as claimed in claim 8 including means responsive to the detected phase for controlling the color and tint or intensity of a color flow Doppler display.

* * * * *